United States Patent
Leenders et al.

(10) Patent No.: US 6,383,692 B1
(45) Date of Patent: May 7, 2002

(54) FLEXOGRAPHIC PRINTING PLATE PRECURSOR COMPRISING A (PHOTO) THERMOGRAPHIC RECORDING LAYER

(75) Inventors: Luc Leenders; Eddie Daems, both of Herentals; Ronn Andriessen, Beerse, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/616,062

(22) Filed: Jul. 13, 2000

Related U.S. Application Data

(60) Provisional application No. 60/147,387, filed on Aug. 6, 1999.

(30) Foreign Application Priority Data

Jul. 13, 1999 (EP) .............................................. 99202290

(51) Int. Cl.⁷ ............................ G03F 7/06; G03F 7/095; G03F 7/30; G03F 7/38
(52) U.S. Cl. ........................ 430/5; 430/273.1; 430/306; 430/327; 430/330; 430/502
(58) Field of Search .............................. 430/306, 273.1, 430/327, 202, 502, 330, 5

(56) References Cited

U.S. PATENT DOCUMENTS

| | | | | |
|---|---|---|---|---|
| 3,245,793 A | * | 4/1966 | Smith | 430/306 |
| 3,730,717 A | * | 5/1973 | Chu et al. | 430/306 |
| 3,867,150 A | * | 2/1975 | Ketley | 430/306 |
| 4,555,471 A | * | 11/1985 | Barzynski | 430/273.1 |
| 4,649,098 A | * | 3/1987 | Takeda | 430/202 |
| 5,171,657 A | * | 12/1992 | Kagami et al. | 430/202 |
| 5,258,282 A | * | 11/1993 | Kagami et al. | 430/273.1 |
| 5,759,742 A | | 6/1998 | West et al. | |
| 5,998,067 A | * | 12/1999 | Gelbart | 430/5 |
| 6,063,546 A | * | 5/2000 | Gelbart | 430/306 |

OTHER PUBLICATIONS

Morgan, "Dry Silver Photographic Materials", *Handbook of Imaging Materials*, 1991, Marcel Dekker, N.Y., 1991.*

* cited by examiner

*Primary Examiner*—Richard L. Schilling
(74) *Attorney, Agent, or Firm*—Breiner & Breiner, L.L.C.

(57) ABSTRACT

A material is disclosed which is suitable for making a flexographic printing plate and comprises in the order given a base, a photopolymer layer and a photothermographic or thermographic recording layer which contains an organic silver salt. By image-wise exposing the recording layer, a photomask is obtained through which the photopolymer layer can be subsequently exposed. Using a suitable solvent, the (photo)thermographic recording layer can be removed and the unexposed areas of the photopolymer layer can be washed out simultaneously in a single development step. The relief image thus obtained can be used as a print master for flexographic printing.

9 Claims, No Drawings

FLEXOGRAPHIC PRINTING PLATE PRECURSOR COMPRISING A (PHOTO) THERMOGRAPHIC RECORDING LAYER

Priority is claimed under 35 USC 119(e) based on provisional application Serial No. 60/147,387 filed Aug. 6, 1999.

FIELD OF THE INVENTION

The present invention relates to a material that is suitable for making a flexographic printing plate. More specifically the invention is related to a material which comprises a photopolymer layer and a (photo)thermographic recording layer which can be exposed image-wise so as to obtain a mask for subsequent flood exposure of the photopolymer layer.

BACKGROUND OF THE INVENTION

Flexographic printing plates typically comprise a base and a photopolymer layer which is cured by image-wise exposure to (UV) light. During a subsequent processing step, the unexposed areas are removed by a developing liquid and a relief plate is obtained wherein the printing areas are raised above the surrounding non-printing areas. The relief image distinguishes flexography from other printing techniques such as lithography (planographic process wherein printing and non-printing areas are part of the same surface) and gravure (printing areas are recessed below the level of the non-printing areas).

Image-wise exposure of a flexographic plate is generally obtained by flood exposure of the photopolymer layer through a contact mask which is typically a film negative that is transparent in printing areas and opaque in the non-printing areas. Film production can be avoided by direct imaging of computer data onto flexographic plates by means of a digitally controlled imaging unit. Such computer-to-plate methods are becoming a major trend in the art. The associated plates are often called digital plates WO 97/00777, U.S. Pat. No. 4,555,471, EP-A 487 260 and EP-A 491 457 describe digital plates comprising in the order given a base, a photopolymer layer, a peelable support and an image recording layer. After exposure to heat or light, e.g. by means of a laser or thermal head, and optional processing, an image is formed in the recording layer which can be used as a mask for exposure of the photopolymer layer. After flood UV-exposure through the mask, the support and the recording layer are peeled off and the photopolymer layer can be processed. For easy removal, the support can be silicon-coated or adhered to the photopolymer layer by a peelable adhesive as described in WO 97/00777. The image recording layer, carried by said peelable support is preferably a system which does not require wet processing to obtain the photomask after image-wise exposure. Suitable examples are e.g. an ablative layer which comprises a heat- or light-sensitive compound, such as a metal, a dye or a pigment such as carbon black. Typical ablative systems are described in WO 94/03838, WO 96/016356, EP-A 720 057, EP-A 741 330, EP-A 767 407 and U.S. Pat. No. 5,654,125. Other suitable image recording layers are thermochromic systems (U.S. Pat. No. 4,555,471), photothermographic compositions containing an organic silver salt, a silver halide and a reducing agent (EP-A 509 740, EP-A 530 674, U.S. Pat. No. 5,258,282, EP-A 491 457), or can be based on heat-induced coalescence of metal particles (EP-A 875 889 and references therein).

A disadvantage of the digital plates which are described above is the low pliancy due to the presence of two supports: the base of the photopolymer layer and the peelable support of the image recording layer. As a solution an image recording layer which dissolves in the processing liquid can be applied directly on the photopolymer layer as described in U.S. Pat. No. 4,288,528, EP-A 767 407, EP-A 741 330 and EP-A 720 057. The image recording layer of these plates are all ablative layers which can be selectively removed by a laser beam, so that a photomask is obtained without wet processing of the image recording layer. A problem associated with ablative systems is the generation of debris which may contaminate the optical and mechanical devices of the laser exposure unit used for direct exposure of the digital plate. In addition, ablative systems are characterised by a low speed, and therefore require high power lasers for exposure. Another disadvantage associated with a digital plate comprising a support between the photopolymer layer and the image recording layer, is the lower sharpness of the relief image due to the fact that the mask and the photopolymer layer are not in close proximity but separated by a distance equal to the thickness of the support.

SUMMARY OF THE INVENTION

It is an object of the present invention to provide an improved material which is suitable for making a flexographic printing plate by direct exposure to heat or light and is characterised by a high pliancy, a high speed and a high image quality. In addition, it is an object of the present invention to provide a convenient material which does not require wet processing to produce a photomask and does not generate debris upon said direct exposure. This object is realised by the material having the specific features defined in claim 1. Specific features for preferred embodiments of the invention are disclosed in the dependent claims.

Further advantages and embodiments of the present invention will become apparent from the following description.

DETAILED DESCRIPTION OF THE INVENTION

The material of the present invention is a flexographic printing plate precursor and comprises in the order given a base, a photopolymer layer and a (photo)thermographic recording layer. Upon image-wise exposure to heat or light, an image is produced in the (photo)thermographic recording layer which then can be used as a photomask for the subsequent flood exposure of the photopolymer layer. Using a suitable solvent, the (photo)thermographic recording layer can be removed and the unexposed areas of the photopolymer layer can be washed out in a single development step. As a result, a relief image is developed which can be used as a print master for flexographic printing. Since there is no intermediate support present between the recording layer and the underlying photopolymer layer, the relief image is very sharp. The term intermediate "support" is to be understood in the meaning of an intermediate self-supporting foil, e.g. a plastic foil, distinguished from an intermediate "layer" which is not self-supporting, e.g. a coated layer such as the barrier layer referred to below.

The feature "(photo)thermographic" embraces photothermographic systems which contain a photosensitive element of which the colour or optical density can be changed by image-wise exposure to light and subsequent development by heat as well as so-called direct thermographic systems which contain a thermosensitive element of which the colour or optical density can be changed by image-wise heating without requiring a further heat treatment or other processing step. The recording layer used in the present invention is a photothermographic or thermographic layer comprising an organic silver salt. The photothermographic recording layer comprises a silver halide in catalytic association with a substantially light-insensitive organic silver salt or a component which is capable of forming photosensitive silver halide with the substantially light-insensitive organic silver salt. The thermographic recording layer does not require the presence of a photosensitive component and can be handled in daylight. Accordingly, thermographic systems provide higher convenience than photothermographic materials and, therefore, a thermographic recording layer is preferred in the present invention.

The major components of suitable (photo)thermographic recording layers which are based on organic silver salts will now be discussed. Preferred substantially light-insensitive organic silver salts for use in the present invention are silver salts of aliphatic carboxylic acids known as fatty acids, wherein the aliphatic carbon chain has preferably at least 12 C-atoms, e.g. silver laurate, silver palmitate, silver stearate, silver hydroxystearate, silver oleate and silver behenate, which silver salts are also called "silver soaps". Further useful substantially light-insensitive organic silver salts are described in U.S. Pat. No. 4,504,575, EP-A 227 141, GB-P 1,111,492, GB-P 1,439,478 and U.S. Pat. No. 4,260,677. A suspension of particles containing a substantially light-insensitive organic silver salt may be obtained by using a process, comprising simultaneous metered addition of a solution or suspension of an organic compound with at least one ionizable hydrogen atom or its salt; and a solution of a silver salt to a liquid, as described in EP-A 754 969.

Suitable organic reducing agents for the heat-induced reduction of the substantially light-insensitive organic silver salts are organic compounds containing at least one active hydrogen atom linked to O, N or C, such as is the case with, mono-, bis-, tris- or tetrakis-phenols; mono- or bis-naphthols; di- or polyhydroxynaphthalenes; di- or polyhydroxybenzenes; hydroxymonoethers such as alkoxynaphthols, e.g. 4-methoxy-1-naphthol described in U.S. Pat. No. 3,094,41; pyrazolidin-3-one type reducing agents, e.g. PHENIDONE (tradename); pyrazolin-5-ones; indan-1,3-dione derivatives; hydroxytetrone acids; hydroxytetronimides; 3-pyrazolines; pyrazolones; reducing saccharides; aminophenols e.g. METOL (tradename); p-phenylenediamines, hydroxylamine derivatives such as for example described in U.S. Pat. No. 4,082,901; reductones e.g. ascorbic acids; hydroxamic acids; hydrazine derivatives; amidoximes; n-hydroxyureas; and the like, see also U.S. Pat. Nos. 3,074,809, 3,080,254, 3,094,417 and 3,887,378.

Among useful aromatic di- and tri-hydroxy compounds having at least two hydroxy groups in ortho- or para-position on the same aromatic nucleus, e.g. benzene nucleus, hydroquinone and substituted hydroquinones, catechol, pyrogallol, gallic acid and gallic acid esters are preferred. Particularly useful are polyhydroxy spiro-bis-indane compounds, especially these which are disclosed in EP-A 779 539. Particularly preferred catechol-type reducing agents are described in EP-A 692 733.

Polyphenols such as the bisphenols used in the 3M Dry Silver™ materials, sulfonamide phenols such as used in the Kodak Dacomatic™ materials, and naphthols are particularly preferred for photothermographic recording materials with photo-addressable thermosensitive elements on the basis of photosensitive silver halide/organic silver salt/reducing agent.

The above mentioned reducing agents being considered as primary or main reducing agents may be used in conjunction with so-called auxiliary reducing agents. Such auxiliary reducing agents are e.g. sterically hindered phenols, that on heating become reactive partners in the reduction of the substantially light-insensitive organic silver salt such as silver behenate, as described in U.S. Pat. No. 4,001,026; or are bisphenols, e.g. of the type described in U.S. Pat. No. 3,547,648. The auxiliary reducing agents may be present in the imaging layer or in a polymeric binder layer in thermal working relationship thereto. Preferred auxiliary reducing agents are sulfonamidophenols corresponding to the following general formula:

Aryl-$SO_2$—NH-Arylene-OH in which Aryl represents a monovalent aromatic group, and Arylene represents a bivalent aromatic group, having the —OH group preferably in para-position to the —$SO_2$—NH— group.

Other auxiliary reducing agents that may be used in conjunction with the above mentioned primary reducing agents are disclosed in U.S. Pat. No. 5,464,738, U.S. Pat. No. 5,496,695, U.S. Pat. No. 3,460,946 and U.S. Pat. No. 3,547,648.

The (photo)thermographic recording layer may further contain a film-forming binder that may be solvent soluble or solvent dispersible or may be water soluble or water dispersible. Film-forming binders of all kinds of natural, modified natural or synthetic resins or mixtures of such resins, wherein the organic silver salt can be dispersed homogeneously are suitable: e.g. cellulose derivatives such as ethylcellulose, cellulose esters, e.g. cellulose nitrate, carboxymethylcellulose, starch ethers, galactomannan, polymers derived from α,β-ethylenically unsaturated compounds such as polyvinyl chloride, after-chlorinated polyvinyl chloride, copolymers of vinyl chloride and vinylidene chloride, copolymers of vinyl chloride and vinyl acetate, polyvinyl acetate and partially hydrolyzed polyvinyl acetate, polyvinyl alcohol, polyvinyl acetals, copolymers of acrylonitrile and acrylamide, polyacrylic acid esters, polymethacrylic acid esters, polystyrene and polyethylene or mixtures thereof.

The film-forming binders suitable for (photo) thermosensitive elements coated from aqueous dispersions may be all kinds of transparent or translucent water-dispersible or water-soluble natural, modified natural or synthetic resins or mixtures of such resins, wherein the organic silver salt can be dispersed homogeneously: for example proteins, such as gelatin and gelatin derivatives (e.g. phthaloyl gelatin), cellulose derivatives, such as carboxymethylcellulose, polysaccharides, such as dextran, starch ethers etc., polyvinyl alcohol, polyvinylpyrrolidone, acrylamide polymers, homo- or co-polymerized acrylic or methacrylic acid, latexes of water dispersible polymers, with or without hydrophilic groups, or mixtures thereof.

The binder of the (photo)thermographic recording layer is preferably soluble in the liquid which is used for developing the photopolymer layer. Such developing liquids may be non-aqueous solutions, and then the solvent-soluble binders, e.g. poly(vinyl butyral), are preferred. Alternatively, the developing liquid may be an aqueous solution and then, water-soluble binders such as gelatin are preferred.

The above mentioned binders or mixtures thereof may be used in conjunction with waxes or "heat solvents" also called "thermal solvents" or "thermosolvents" improving the reaction speed of the redox-reaction at elevated temperature.

The (photo)thermographic recording layer of the present invention may also comprise at least one polycarboxylic acid and/or anhydride thereof in a molar percentage of at least 20 with respect to all the organic silver salt(s) present and in thermal working relationship therewith. Preferred saturated aliphatic dicarboxylic acids are those containing at least 4 carbon atoms, e.g. adipic acid and pimelic acid. Preferred aromatic polycarboxylic acids are orthophthalic acid and tetrachlorophthalic acid and the anhydrides thereof.

The (photo)thermographic recording layer of the present invention may further comprise a so-called toning agent. Suitable examples are succinimide, phthalazine and the phthalimides and phthalazinones within the scope of the general formulae described in U.S. Pat. No. 4,082,901. Further suitable toning agents are described in U.S. Pat. Nos. 3,074,809, 3,446,648 and 3,844,797. Other particularly useful toning agents are the heterocyclic toner compounds of the benzoxazine dione or naphthoxazine dione type described in GB-P 1,439,478 and U.S. Pat. No. 3,951,660 with the toning agent benzo[e][1,3]oxazine-2,4-dione being particularly suitable for use in combination with polyhydroxy benzene reducing agents.

The photothermographic recording layer may comprise a photosensitive silver halide in a range of 0.75 to 25 mol percent and, preferably, from 2 to 20 mol percent of the substantially light-insensitive organic silver salt. The silver halide may be silver bromide, silver iodide, silver chloride, silver bromoiodide, silver chlorobromoiodide, silver chlorobromide etc. The silver halide may be in any form which is photosensitive including, but not limited to, cubic, orthorhombic, tabular, tetrahedral, octagonal etc. and may have epitaxial growth of crystals thereon.

A suspension of particles containing a substantially light-insensitive silver salt of an organic carboxylic acid may be obtained by using the process described in EP-A 754 969. The silver halide may be added to the photothemographic element in any fashion which places it in catalytic proximity to the substantially light-insensitive organic silver salt. A particularly preferred mode of preparing the emulsion of organic silver salt and photosensitive silver halide for coating of the photothermographic element from solvent media, according to the present invention is that disclosed in U.S. Pat. No. 3,839,049, but other methods such as those described in Research Disclosure, June 1978, item 17029 and U.S. Pat. No. 3,700,458 may also be used for producing the emulsion.

The photothermographic recording layer of the present invention may contain a spectral sensitizer, optionally together with a supersensitizer, for the silver halide. Suitable sensitizers of silver halide to infra-red radiation include those disclosed in the EP-A's 465 078, 559 101, 616 014 and 635 756, the JN's 03-080251, 03-163440, 05-019432, 05-072662 and 06-003763 and the U.S. Pat. Nos. 4,515,888, 4,639,414, 4,713,316, 5,258,282 and 5,441,866. Suitable supersensitizers for use with infra-red spectral sensitizers are disclosed in EP-A's 559 228 and 587 338 and in the U.S. Pat. Nos. 3,877,943 and 4,873,184.

The (photo)thermographic recording layer may contain other additives such as free fatty acids, surface-active agents, antistatic agents, e.g. non-ionic antistatic agents including a fluorocarbon group as e.g. in F$_3$C(CF$_2$)$_6$CONH (CH$_2$CH$_2$O)—H, silicone oil, e.g. BAYSILONE Öl A (tradename of BAYER AG—GERMANY), ultraviolet light absorbing compounds, white light reflecting and/or ultraviolet radiation reflecting pigments, fine polymeric particles [e.g. of poly(methylmethacrylate)] and/or optical brightening agents.

The (photo)thermographic recording layer preferably contains a stabiliser compound such as an unsaturated carbocyclic or heterocyclic compound substituted with a —SA group where A is hydrogen, a counterion to compensate the negative charge of the thiolate group or a group forming a symmetrical or an asymmetrical disulfide. Said stabiliser compound may be further substituted, which substitution also includes the atoms necessary to form an annulated unsaturated carbocyclic or heterocyclic ring system. Preferred substituents include acylamido, aryl—SO$_2$NH—, alkyl-SO$_2$NH—, aryl-NHSO$_2$—, alkyl-NHSO$_2$—, arylamino, alkyl, aryl, nitro and cyano groups and halogen atoms. Preferred stablizer compounds used in the present invention have an unsaturated 5- or 6-membered ring. According to a preferred embodiment of the stabilizer compounds used in the present invention the stabilizer compound is represented by formula (I)

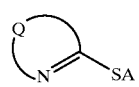

(I)

wherein Q are the necessary atoms to form a 5- or 6-membered aromatic heterocyclic ring, which may also be substituted, A is selected from hydrogen, a counterion to compensate the negative charge of the thiolate group or a group forming a symmetrical or an asymmetrical disulfide.

Particularly preferred stabilizer compounds used in the present invention are represented by the formulae:

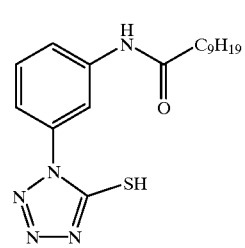

Cpd 1

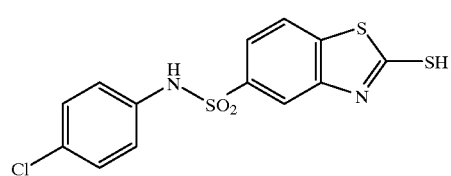

Cpd 2

Other suitable examples of stabiliser compounds have been described in EP-A no. 98202542, filed on Jul. 29, 1998.

The flexographic printing plate precursor of the present invention may further contain an outermost protective layer provided on the (photo)thermographic recording layer. Especially a thermographic system which is exposed by direct contact with a thermal head may benefit from such a protective layer so as to avoid local deformation of the thermosensitive element and to improve resistance against abrasion.

The protective layer preferably comprises a binder, which may be hydrophobic (solvent soluble) or hydrophilic (water soluble). Among the hydrophobic binders polycarbonates as described in EP-A 614 769 are particularly preferred. The hydrophobic binders described above for use in the (photo) thermographic recording layer are also suitable. Suitable hydrophilic binders for the protective layer are, for example, gelatin, polyvinylalcohol, cellulose derivatives or other polysaccharides, hydroxyethylcellulose, hydroxypropylcellulose etc., with polyvinylalcohol being particularly preferred.

Similarly to the indication above in the discussion of the binder of the (photo)thermographic recording layer, also the binder of the protective layer is preferably selected such that the protective layer can be removed with the same liquid as used for developing the photopolymer layer.

The protective layer may further comprise a matting agent and/or a lubricant. Suitable matting agents are described in WO 94/11198 and include e.g. talc particles and optionally protrude from the outermost layer. Preferred lubricants are solids which have a melting point below 150° C. Preferred are solid lubricants having a melting point below 110° C., with solid lubricants with a molecular weight below 1000 being particularly preferred. For the purposes of the present invention solid lubricants are defined as those lubricants being solid at room temperature. Suitable examples of such solid lubricants are polyolefin waxes e.g. polypropylene waxes, ester waxes e.g. fatty acid esters, polyolefin-polyether block copolymers, amide waxes e.g. fatty acid amides, polyglycols e.g. polyethylene glycol, fatty acids, fatty alcohols, natural waxes and solid phosphoric acid derivatives. Preferred solid lubricants are fatty acid esters, polyolefin-polyether block copolymers and fatty acid amides.

The coating of any of the above layers may proceed by any coating technique e.g. such as described in Modern Coating and Drying Technology, edited by Edward D. Cohen and Edgar B. Gutoff, (1992) VCH Publishers Inc., 220 East 23rd Street, Suite 909 New York, N.Y. 10010, U.S.A.

Instead of coating a protective layer, or in addition to such protective layer, the flexographic printing plate precursor of the present invention can also be covered by a protective foil. Said foil may be removed before image-wise exposure. When a thermal printhead is used to heat-expose a thermographic recording layer of a material according to the present invention, it may be preferred to carry out said exposure while the protective foil is present in order to avoid direct contact of the thermal head with the recording layer. Useful foils include e.g. cellulose nitrate film, cellulose acetate film, polyvinylacetal film, polystyrene film, polyethylene terephthalate film, polycarbonate film, polyvinylchloride film or poly-α-olefin films such as polyethylene or polypropylene film. The thickness of such organic resin film is preferably comprised between 5 and 20 μm. In a most preferred embodiment of the present invention the protective foil is a poly(ethylene terephthalate) (PET) film provided with a release layer such as a silicon coating or a peelable adhesive. A preferred protective foil is a 5 μm PET foil provided with a subbing layer, a heat-resistant layer and a slipping layer (anti-friction layer) giving a ribbon with a total thickness of 6 μm.

Thermographic imaging is carried out by the image-wise application of heat either in analogue fashion by direct exposure through an image of by reflection from an image, or in digital fashion pixel by pixel either by using an infra-red heat source, for example with a Nd-YAG laser or other infra-red laser, or by direct thermal imaging with a thermal head.

In thermal printing image signals are converted into electric pulses and then through a driver circuit selectively transferred to a thermal printhead. The thermal printhead consists of microscopic heat resistor elements, which convert the electrical energy via the Joule effect into heat, which is transferred to the surface of the thermographic material, wherein the chemical reaction results a in increased optical density. Such thermal printing heads may be used in contact or close proximity with the recording layer. The operating temperature of common thermal printheads is in the range of 300 to 400° C. and the heating time per picture element (pixel) may be less than 1.0 ms, the pressure contact of the thermal printhead with the recording material being e.g. 200–500 g/cm$^2$ to ensure a good transfer of heat.

The image which is recorded in the (photo)thermographic recording layer can be a screened image or a line pattern image or a combination of both. The use of the (photo)thermographic layers described herein enables to obtain a photomask with a transmission optical density in the image areas of at least 2.0, preferably higher than 3.0 and most preferably higher than 3.5. Said transmission optical density is obtained at the same wavelength or wavelength range as the light used for the flood exposure of the photopolymer layer through the photomask. When the flood exposure is not carried out with monochromatic light but with a wavelength range, then said transmission optical density is the average density within said wavelength range.

The photopolymer layer comprises the compositions known in the art of flexographic printing. Typical compositions are photosensitive to light having a wavelength in the range from 300 to 420 nm. In addition to the positive-working systems such as those based on o-quinonediazide, the negative-working photopolymerisable and/or photo-crosslinkable systems are preferred. Such systems typically comprise a monomer compound having at least one reactive vinyl group in its molecule. The reactive vinyl group in these compounds includes substituted or unsubstituted vinyl groups having polymerization reactivity, as exemplified by styrene type vinyl groups, acrylic acid type vinyl groups, methacrylic acid type vinyl groups, allyl type vinyl groups, and vinyl ether type vinyl groups, as well as ester vinyl groups as in vinyl acetate.

Examples of the polymerizable polymer precursor satisfying such conditions may include, for example monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, beta -chloroethyl vinyl ether, phenyl vinyl ether, p-methylphenyl vinyl ether, and p-chlorophenyl vinyl ether;

difunctional monomers such as divinylbenzene, distyryl oxalate, distyryl malonate, distyryl succinate, distyryl glutarate, distyryl adipate, distyryl maleate, distyryl fumarate, distyryl beta,beta'-dimethylglutarate, distyryl 2-bromoglutarate, distyryl alpha,alpha'-dichloroglutarate, distyryl terephthalate, oxalic acid di(ethyl acrylate), oxalic acid di(methyl ethyl acrylate), malonic acid di(ethyl acrylate), malonic acid di(methyl-ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), beta,beta'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis (acryloyloxymethylethoxycarbamoyl)benzene, 1,4-bis (acryloyloxyethoxycarbamoyl)cyclohexane, bis (acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), beta,beta'-dimethylglutaric acid di(ethyl methacrylate), 1,4-phenylenebis(oxyethyl methacrylate), and 1,4-bis (methacryloyloxyethoxy)cyclohexane, acryloyloxyethoxyethyl vinyl ether;

trifunctional monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri (ethyl acrylate), 1,1,1-trimethylolpropane tri (ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product pattern 1,1,1-trimethylolpropane and three-fold moles of hexanediisocyanate, with p-hydroxystyrene;

and tetrafunctional monomers such as ethylenetetraacrylamide, and pylenetetraacrylamide. Two or more of these polymerizable polymer precursors can be used in combination.

The photopolymerization initiator used in the present invention may include, for example, carbonyl compounds, sulfur compounds, halogen compounds, photopolymerization initiators of redox type, and peroxide initiators sensitized with dye such as pyrilium. Specifically, the carbonyl compounds include diketones as exemplified by phenyl, 4,4'-dimethoxybenzyl, diacetyl, and camphorquinone; benzophenones as exemplified by 4,4'-bis(diethylamino) benzophenone, and 4,4'-dimethoxylbenzophenone; acetophenones as exemplified by acetophenone, and 4-methoxyacetophenone; benzoin alkyl ethers; thioxanthones as exemplified by 2-chlorothioxanthone, 2,4-dichlorothixanthone, 2,4-diethylthioxanthone, and thioxanthone-3-carboxylic acid-beta-methoxy ethyl ester; chalcones and styrylketones having a dialkylamino group; and cumarins as exemlified by 3,3'-carbonylbis(7-methoxycumarin), and 3,3'-carbonylbis(7-diethylaminocumarin). The sulfur compounds include disulfides as exemplified by dibenzothiazolyl sulfide, and decylphenyl sulfide. The halogen compounds include, for example, carbon tetrabromide, quinolinesulfonyl chloride, and S-triazines having a trihalomethyl group. The photopolymerization initiators of the redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction. Such combination of the photopolymerization initiators includes a combination of styryl ketones or chalcones having a dialkylamino group or cumarins, with S-triazines having a trihalomethyl group or camphorquinone.

The photopolymer layer may contain additional ingredients such as a binder or film-forming agent, a solid solvent, a surfactant, an anti-static agent, a plasticiser to improve the pliancy of the material, a stabiliser to prevent monomers from premature crosslinking during storage, and a dye to permit easy inspection of the plate so that correct exposure and registration can be determined.

The binder or film-forming agent usable in the photopolymer layer may include, for example, cellulose esters, such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate; cellulose ethers, such as methyl cellulose, ethyl cellulose, propyl cellulose, and butyl cellulose; vinyl resins, such as polystyrene, polyvinyl chloride, polyvinyl acetate, polyvinyl butyral, polyvinyl acetal, polyvinyl alcohol, and polyvinyl pyrrolidone; copolymer resins, such as a styrene/butadiene copolymer, a styrene/acrylonitrile copolymer, a styrene/butadiene/acrylonitrile copolymer, and a vinyl chloride/vinyl acetate copolymer; acrylic resins, such as polymethyl methacrylate, polymethyl acrylate, polybutyl acrylate, polyacrylic acid, polymethacrylic acid, polyacrylamide, and polyacrylonitrile; polyesters, such as polyethylene terephthalate; polyarylate resins, such as poly(4,4'-isopropylidene, diphenylene-co-1,4-cyclohexylenedimethylene carbonate), poly(ethylenedioxy-3,3'-phenylene thiocarbonate), poly(4, 4'-isopropylidene, diphenylene carbonate-co-terephthalate), poly(4,4'-isopropylidene,diphenylene carbonate), poly(4,4'-sec-butylidene,diphenylene carbonate), and poly(4,4'-isopropylidene,diphenylene carbonate-blockoxyethylene); plyamides; polyimides; epoxy resins; phenolic resins; polyolefins, such as polyethylene, polypropylene, and chlorinated polyethylene; and natural polymers, such as gelatin.

Highly preferred binders are elastomeric polymers such as polyalkadienes, vinylaromatic/alkadiene-copolymers and -blockcopolymers, alkadiene-acrylonitrile-copolymers, ethylene-propylene-copolymers, ethylene-propylene-alkadiene-copolymers, ethylene-(acrylic acid)-copolymers, alkadiene-(acrylic acid)-copolymers, alkadiene-acrylate-(acrylic acid)-copolymers and ethylene-((meth)acrylic acid)-(meth)acrylate-copolymers.

A specific photopolymer composition, which may be used in the material of the present invention, comprises an elastomer such as a rubber chosen for its specific hardness, e.g. polyisoprene, a monomer which undergoes radical-induced photopolymerisation, e.g. butanedioldiacrylate, and a photoinitiator such as benzildimethylketal which upon light absorption during the flood exposure step produces radicals that trigger the polymerisation reaction.

The base of the material of the present invention is preferably a dimensionally stable foil which is transparent in the wavelength range used for obtaining the so-called floor of the flexographic printing plate by back-exposure of the photopolymer layer. The same plastic resins as indicated above for the protective foil can be used. Poly(ethylene therephtalate) (PET) foil is a preferred example. Also metal sheets or metal-coated substrates are suitable as base of the material of the present invention. Typical examples are aluminium, steel or copper sheets. The base may be mechanically and/or chemically pre-treated or provided with an adhesive layer in order to ensure good adhesion to the photopolymer layer. Such an adhesive layer can consist, for example, of the conventional single- or two-component adhesives, e.g. those based on polyurethane. The base can further carry an antihalation layer below the photopolymer layer.

The material of the present invention preferably also comprises a transparent barrier layer between the photopolymer layer and the (photo)thermographic recording layer. This barrier layer prevents diffusion of monomers from the photopolymer layer to the (photo)thermographic recording layer. Highly preferred polymers for use as a barrier are polyamides or copolyamides, e.g. those obtained from bifunctional carbonic acids such as adipinic acid and diamines or ω-amino acids, lactams or derivates thereof, e.g. nylon 3, 4, 5, 6, 8, 11, 12, 13, 6.6, 6.10 or 6.13; metaxylene diamine; trimethyl-hexamethylene diamine; isophoron diamine; 4,4-diaminedicylcohexylmethane; or the N-methylol or N-alkoxymethyl derivatives of these homo- and copolyamides. Other preferred barrier polymers are hydroalkylcellulose (alkyl being preferably ethyl or propyl) and fully or partially hydrolysed poly(vinyl alcohol) alkanecarboxylate esters such as poly(vinyl acetate) or poly(vinyl propionate) having an hydrolysis grade of 88 to 98%.

EXAMPLES

A siliconised PET film having a thickness of 25 μm was provided with a thermographic recording layer by coating the ingredients indicated in Table 1. These ingredients were dissolved in methylethylketone and Mersolat H80 (sodium hexadecylsulphonate), trade name of Bayer AG, and Ultravon W (sodium arylsulphonate), trade name of Ciba-Geigy, were added as surfactant. The coated layer was dried for 1 hour at room temperature, followed by 1 hour at 50° C. The material thus obtained is defined as material A.

TABLE 1

| Compound | Function | Amount (g/m$^2$) |
| --- | --- | --- |
| Silver behenate | organic silver salt | 6.2 |
| Poly(vinyl butyral) (a) | binder | 5.2 |
| Ethyl-3,4-dihydroxybenzoate | reducing agent | 1.0 |
| Propyl gallate | reducing agent | 1.15 |
| Baysilone Öl A, defined above | spreading agent | 0.024 |
| Tetrachloro phtalic anhydride | stabiliser | 0.15 |
| Cpd 1, defined above | stabiliser | 0.14 |
| benzo[e][1,3]oxazine-2,4-dione | tone modifier | 0.35 |

(a) Pioloform BR18 from Wacker-Chemie

A material B was then prepared by peeling away the Lumirror X43 protective foil from a Nyloflex FAR 284 flexographic plate precursor (available from BASF), the latter material being composed of a PET base, a photopolymer layer, a polyamide barrier layer and said Lumirror foil. The polyamide barrier layer was also removed from the photopolymer layer using a conventional adhesive tape.

Finally, a material according to the present invention was obtained by laminating the image recording layer of material A to the photopolymer layer of material B using a laminator with heatable rollers at a temperature of 40° C.

The siliconised PET support was removed from the image recording layer. A photomask was then produced by exposing the image recording layer with a digital printer having a thermal head which comprised 300 thin film heat-generating resistors per inch, each controlled by 8-bit addressing. The total amount of electric energy applied per dot at data level 255 was 1.86 mJ. This energy was sufficient to obtain maximum optical density in the thermographic recording layer. The net value of the transmission optical density (t.o.d.) at 360 nm, obtained by substracting the t.o.d. of non-image areas (data level 0) from the t.o.d. of the image areas (data level 255), was 3.7.

Subsequently, the photopolymer layer was exposed to UV light through the photomask, and then the photopolymer layer was developed using Nylosolv II (available from BASF). This treatment also removed the thermographic recording layer. The flexographic printing plate thus obtained produced high quality printed copies.

What is claimed is:

1. A flexographic printing plate precursor comprising in the order given a base, a photopolymer layer, a barrier layer and a photothermographic or thermographic recording layer containing an organic silver salt with the proviso that no support is present between the photopolymer layer and the recording layer.

2. A flexographic printing plate precursor according to claim 1 which further comprises a protective layer on top of the recording layer.

3. A flexographic printing plate precursor according to claim 1 which further comprises a peelable protective foil on top of the recording layer.

4. A flexographic printing plate precursor according to claim 1 wherein the recording layer is a thermographic recording layer of which the optical density can be increased by contact with a heated thermal head without requiring a subsequent heat treatment or other processing step.

5. A method for making a flexographic printing plate comprising the steps of (i) making a photomask consisting of image and non-image areas by image-wise exposing the recording layer of a flexographic printing plate precursor according to any of the previous claims, so that a transmission optical density of at least 2.0 is obtained in the image areas of the photomask;

(ii) exposing the photopolymer layer to light through the photomask;

(iii) processing the photopolymer layer using a developing liquid;
   wherein said transmission optical density is measured at the wavelength or wavelength range of the light used during the flood exposure.

6. A method according to claim 5 wherein the recording layer is removed during step (iii).

7. A method according to claim 5 wherein the recording layer is a thermographic layer which is image-wise exposed to heat and wherein said transmission optical density is obtained upon image-wise exposure without subsequent heat treatment or other processing step after said image-wise exposure.

8. A method according to claim 5 wherein the transmission optical density is at least 3.0.

9. A method according to claim 5 wherein the transmission optical density is at least 3.5.

* * * * *

UNITED STATES PATENT AND TRADEMARK OFFICE
Certificate

Patent No. 6,383,692 B1                                            Patented: May 7, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Luc Leenders, Herentals, Belgium; Eddie Daems, Herentals, Belgium; Ronn Andriessen, Beerse, Belgium; Sabine Philipp, Bickenbach, Germany; and Alfred Leinenbach, Willstatt, Germany.

Signed and Sealed this Sixteenth Day of December 2003.

*JANET C. BAXTER*
*Supervisory Patent Examiner*
*Art Unit 1752*